Nov. 20, 1962

J. I. PANKOVE 3,065,392

SEMICONDUCTOR DEVICES

Filed Feb. 7, 1958

INVENTOR.
JACQUES I. PANKOVE
BY J L Whittaker
ATTORNEY

United States Patent Office 3,065,392
Patented Nov. 20, 1962

3,065,392

SEMICONDUCTOR DEVICES

Jacques I. Pankove, Princeton, N.J., assignor to Radio Corporation of America, a corporation of Delaware Filed Feb. 7, 1958, Ser. No. 713,860
8 Claims. (Cl. 317—235)

This invention relates to semiconductor circuit elements, and more particularly to improved junction transistor devices having at least one internal PN junction therein.

Junction transistor devices generally comprise a monocrystalline semiconductive body having two spaced zones of given conductivity type material separated by an intermediate zone of opposite conductivity type. Between the intermediate zone and each adjacent zone there is formed an interface which constitutes the site of a rectifying barrier known as a PN junction. The electrical conductivity across each PN junction is asymmetrical, being high in a preferred direction known as the forward direction, and being low in the opposite direction known as the reverse direction. In a junction transistor one of the two spaced zones is known as the emitter, the other spaced zone is called the collector, while the intermediate opposite conductivity type zone is known as the base. The mobile charge carriers which are the majority type present in the emitter and collector zones are the minority type present in the base region. In transistor action, minority carriers are injected into the base from the emitter, and diffuse across the base zone to the collector. While the collector current of an ordinary triode junction transistor is always less than the emitter current, the resistance of the reverse-biased collector junction is high compared to the resistance of the forward-biased emitter junction, hence substantial voltage gain and power gain is obtained.

When a reverse bias is applied to a PN junction, the applied potential is poled negative to the P region and positive to the N region, so that the height of the potential hill across the barrier is increased. The flow of positive charge carriers (holes) from the P region across the junction to the N region is thereby greatly diminished, since the holes have to climb up a potential hill in moving from a region of low potential to a region of high potential. A reverse bias of a few tenths of a volt is sufficient to decrease the hole current from the P region to the N region to practically zero. However, the flow of holes from the N region to the P region is almost unaffected by the applied potential. As the reverse voltage increases, the hole current from the N region to the P region tends to approach a limiting value which is known as the saturation hole current. The reverse bias similarly reduces to negligible amounts the current of negative charge carriers (electrons) flowing from the N region to the P region, but leaves the electron current from the P region to the N region almost unaffected. The total saturation current across a reverse-biased junction is thus the sum of the hole current from the N region to the P region, and the electron current from the P region to the N region.

In conventional junction transistors, each of the two rectifying barriers intercepts the surface of the semiconductor body. Some current leaks across the surface intercept of each junction in the reverse direction. The leakage current increases as the length of the junction surface intercept, known as the leakage path, increases. The magnitude of the leakage current also depends inter alia on the recombination velocity of electrons and holes on the surface of the transistor, the lifetime of charge carriers in the bulk of the transistor, and the relative resistivity of the P and N regions. The total reverse current across a reverse-biased PN junction, for example the collector junction of a conventional junction transistor, is thus the sum of the saturation current and the leakage current. At ordinary temperatures, the thermal energy of the semiconductive body of the transistor is sufficient to disrupt some of the electron-hole pairs present, so that some charge carriers are always available to flow across the collector junction in the reverse direction. As this charge carrier flow or saturation current is a thermal energy effect, it varies as the temperature of the semiconductive body. In a practical junction transistor, for example a PNP triode device, the leakage current is the more important component of the reverse current, since the leakage current is larger than the saturation current.

The reverse current of a transistor is generally defined as the current which flows across the collector junction in the reverse direction when the emitter current is zero. Since the input signal is usually applied to the emitter, the transistor reverse current constitutes that portion of the output current which is not controlled by the signal input. It is therefore desirable to minimize the reverse current across the collector junction in order to increase the response sensitivity of the transistor to an applied signal.

An object of this invention is to provide improved semiconductor devices.

Another object of this invention is to provide improved junction transistors.

Yet another object is to provide improved transistors having increased response sensitivity to an applied signal.

Still another object is to provide improved transistors having decreased reverse current across the collector junction.

These and other objects of this invention are accomplished by providing a circuit element such as a junction transistor with an internal junction around a central zone of the circuit element, and electrically conductive connecting means to the central zone. The connecting means serves as the collector electrode of the device, and are ohmic or non-rectifying to the central zone, which becomes the collector region of the transistor.

A typical embodiment of the invention comprises a semiconductor device including a wafer of given conductivity type semiconductive material having a surface zone of conductivity type opposite to that of the central zone of the wafer, and a PN junction at the interface between the surface zone and the wafer interior. Since this PN junction is entirely internal the wafer and does not intercept the wafer surface, it is hereafter designated an internal junction. A collector electrode is formed by alloying a pellet of given conductivity type material to one wafer face so as to extend through the surface zone into the central zone and form a non-rectifying connection thereto. At least one emitter electrode is formed in rectifying contact with a portion of the wafer surface, and at least one base electrode is formed in non-rectifying contact with another portion of the wafer surface. Since the large-area internal junction which serves as the transistor collector junction does not intercept the wafer surface, there is no leakage current across the collector junction except at the small periphery of the collector electrode pellet, and the reverse current of the device is reduced to little more than the relatively small saturation current.

In another embodiment of the invention, a given conductivity type semiconductive wafer having an internal junction and a collector electrode consisting of a pellet of given conductivity type material alloyed to a first portion of one wafer face so as to extend into the central zone as described above, is provided with an emitter electrode contacting a second portion of the same wafer face, a second emitter electrode contacting a first portion of the opposite wafer face, and a third or base electrode contacting a second portion of the opposite wafer face. This embodiment of the invention may be modified by forming the collector and base electrodes on opposite minor faces of the wafer, and forming the two emitter electrodes in contact with opposite major faces of the wafer. These embodiments retain the feature of low reverse current due to a collector junction which is substantially internal so as to have a very small external leakage path, and include a plurality of emitters so that two different signal inputs can be combined in one circuit element.

The invention will be described in greater detail with reference to the accompanying drawing, in which.

Similar elements are designated by similar reference characters throughout the drawing.

Figure 1A:
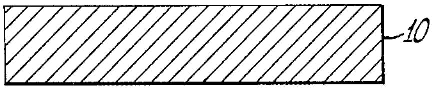
FIGURES 1A–1D are sectional elevational views of successive steps in the fabrication of a first device embodying the principles of the invention.

Referring to FIGURE 1A, a first embodiment of the invention may be fabricated from a wafer 10 of monocrystalline semiconductive material such as germanium or silicon or the like. The wafer 10 is preferably a slab having at least two opposed faces, and may be of either conductivity type. In this example, the wafer 10 is prepared from monocrystalline germanium containing an excess of acceptor impurities so as to be of P-type conductivity. The acceptor impurity may for example be boron, aluminum, gallium, indium, or thallium. In this example sufficient indium was added to the molten wafer material during the preparation of the single crystal so that the germanium is of P-type conductivity.

Figure 1B:
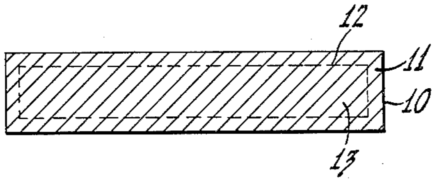

Referring to FIGURE 1B, a surface zone 11 of the wafer 10 is converted to conductivity type opposite to that of the bulk of the wafer. This may be accomplished by diffusing into the surface of the wafer on all of its sides an impurity material which induces conductivity of type opposite to that of the original wafer. Since the instant wafer is P-type, a donor impurity is required. Suitable donor materials are phosphorus, arsenic, antimony and bismuth. In this example, the wafer 10 is heated in an atmosphere containing arsenic vapors so that sufficient arsenic atoms diffuse into the wafer to convert a surface zone 11 to N-type conductivity. Another method of diffusing an impurity into a semiconductive wafer from the vapor state is disclosed in application Serial No. 598,180, filed July 16, 1956, of C. W. Mueller and R. L. Sherwood, assigned to the same assignee. The thickness of the arsenic-diffused zone 11 may be controlled by varying the time and temperature of heating. In this example, the P-type germanium wafer 10 having a resistivity of about 15 ohm-centimeters is heated in arsenic vapors at 750° C. for 30 minutes, thereby forming an N-type surface zone which is 0.2 mil thick. At the interface between the arsenic-diffused surface zone 11 and the central zone 13 of the wafer there is formed a rectifying barrier 12 known as a PN junction. The barrier 12 is an internal diffused junction, inasmuch as it does not intercept the surface of the wafer.

Figure 1C:
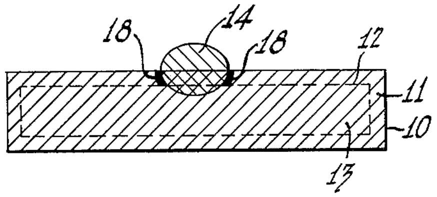

Referring to FIGURE 1C, a pellet 14 which serves as the collector electrode is alloyed to one wafer face so as to extend through the surface zone 11 into the interior central zone 13 of the wafer. The pellet 14 is relatively small compared to the wafer 10, and is made of material which induces the same conductivity type as that of the central zone 13 of the wafer, so that the contact between the pellet 14 and the central zone 13 is non-rectifying or ohmic in character. In this example the pellet 14 consists of indium. Other acceptors such as boron, aluminum and gallium may be utilized for this purpose, since the central zone 13 of the wafer 10 is of P-conductivity type.

The surface alloy process is described in an article by Law et al. entitled "A Developmental Germanium PNP Junction Transistor" in the November 1952 Proceedings of the IRE (page 1352). The depth of alloying of the pellet 14 increases as the volume of the pellet and the temperature of alloying increase. A method of calculating the alloying depth of indium in germanium is described by L. Pensak in "Transistors I," RCA Laboratories, Princeton, New Jersey, March 1956, page 112. The method may be extended to any combination of impurity pellet and semiconductor wafer for which the alloy phase diagram is known.

Figure 1D:
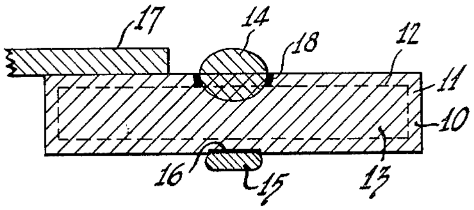

Referring to FIGURE 1D, an emitter electrode is formed by attaching an electrode pellet 15 in rectifying contact with the wafer surface zone 11. In this example, the emitter electrode 15 consists of indium. By heating the pellet 15 in contact with wafer 10 at a relatively low temperature such as 350° C., the pellet is fused to the wafer surface but the penetration of the pellet into the wafer is very slight. It is convenient to fuse the emitter pellet 15 to the wafer surface opposite the collector pellet 14. A PN junction 16 is formed where the indium emitter pellet 15 contacts the N-type surface zone 11. The base region of the device is the surface zone 11. A base tab 17, which may for example be nickel or fernico, is attached to the wafer surface. The nickel tab 17 may be soldered to the wafer 10 utilizing a lead-tin solder, so that the contact between the base tab 17 and the wafer surface zone 11 is non-rectifying or ohmic in character.

When the device shown in FIGURE 1D is operated as a circuit element, a forward bias is maintained between the emitter electrode 15 and the base tab 17, while a reverse bias is maintained between the collector electrode 14 and the base electrode 17. The input signal is applied between the emitter electrode 15 and the base electrode 17, thereby injecting minority carriers (holes in this example) across the emitter junction 16 into the surface zone 11. The minority carriers diffuse across the surface zone 11 to the internal junction 12 and enter the collector region 13, thereby modulating the output current flowing between the base electrode 17 and the collector electrode 14.

A the intersection 18 between the indium electrode 14 and the N-type surface zone 11 a rectifying junction is formed, which in effect is a continuation of the internal PN junction 12. The periphery of junction 18 on the surface of the wafer thus forms a leakage path. However, it is easily demonstrated that this leakage path is much smaller than in conventional transistors having the same collector junction area. For example, let the collector electrode 14 be an indium spherule of radius $r$, so that the leakage path of the instant device is a circle of $2\pi r$ circumference. Let the wafer 10 also be considered the equivalent of a sphere, and the distance from the center of the wafer to the internal junction 12 is R, so that the area of the collector junction is $4\pi R^2$. Then the reverse collector current is equal to the sum of $4\pi R^2 J_s$ and $2\pi r J_1$, where $J_s$ is the saturation current density, $J_1$ is the leakage current density, and $R>r$. Thus the first component is the saturation current which is distributed over the entire area of the internal collector junction 12, while the second component is the leakage current which is concentrated at the surface boundary around the pellet 14. It is apparent that a conventional transistor having a collector junction area as large as that of the instant device would also have a surface intercept or leakage path which would be at least twice that of the device according to the invention. In a practical device, the factor would be greater than two.

Since the concentration of the diffused arsenic in the surface zone 11 is graded from high at the surface to low with increasing depth into the wafer, the conductivity of the surface zone is similarly graded from high to low, thereby inducing an electric field in the zone 11 which tends to accelerate the drift of minority charge carriers from the emitter junction to the collector junction. For details, see "The Drift Transistor," by H. Kroemer, "Transistors I," page 202. The device therefore has the advantages of improved high frequency response, reduced capacitance, and increased breakdown voltage which are found in drift transistors.

Figure 2:
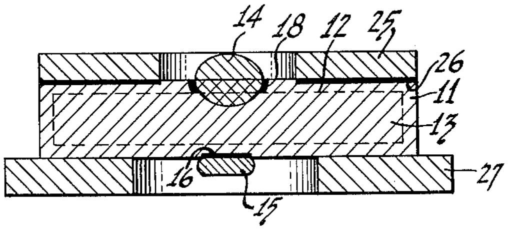
FIGURE 2 is a sectional elevational view of a second device in accordance with the principles of the invention.

Referring to FIGURE 2, in another embodiment of the invention the base tab 27 is attached to the same wafer face as the emitter electrode 15. The base tab 27 may conveniently consist of an annulus or ring made of nickel or fernico or the like. The tab 27 is soldered to the wafer so that the emitter electrode 15 is within the aperture of the ring.

An additional emitter electrode is formed by fusing another electrode pellet 25 to the wafer. The second emitter electrode 25 consists of the same material as the first emitter electrode 15. The two emitter electrodes may be conveniently fused to the wafer in a single operation. The second emitter 25 is preferably attached in rectifying contact to that face of the wafer which bears the collector electrode 14. In this example, the second emitter electrode 25 consists of an indium ring, which is fused to the wafer so that collector electrode 14 is within the aperture of the ring. A PN junction 26 is formed between the emitter electrode 25 and the N-type surface zone 11. When this device is operated as a circuit element, one input signal may be impressed between the first emitter electrode 15 and the base tab 27, while a second input signal may be applied between the second emitter electrode 25 and the base electrode 27. The output current between the collector electrode 14 and the base tab 27 will vary as the sum of the two input signals.

Figure 3:
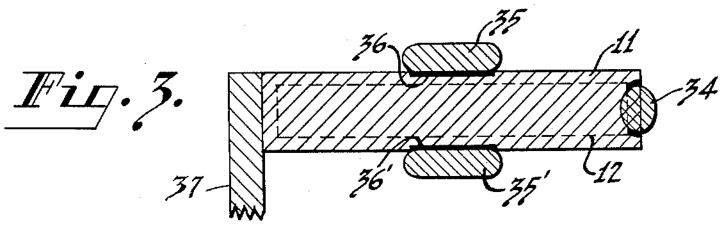
FIGURE 3 is a sectional elevational view of a modification of the device of FIGURE 2.

Referring to FIGURE 3, the principles of the invention may be practiced with a circuit element comprising a given conductivity type semiconductive wafer 10 having opposed major and minor faces and a surface zone 11 of opposite conductivity type. In this embodiment, which is a modificatioin of the device illustrated in FIGURE 2, the collector electrode 34 is alloyed to one minor wafer face so as to extend through the surface zone 11 into the interior zone of the wafer. The base tab 37 is attached to the opposite minor wafer face. Two emitter electrodes 35 and 35′ are attached to opposing major wafer faces in rectifying contact thereto, forming PN junctions 36 and 36′ respectively.

It will be noted that in the double-emitter device illustrated in FIGURES 2 and 3 the two emitters are on opposite faces of the wafer. Nevertheless, there is a drift field between each emitter and the internal collector junction, so that the passage of minority charge carriers from each emitter across the surface zone 11 is accelerated.

As is well known in the art, the conductivity types of the various zones and electrodes illustrated may be reversed. For example, a semiconductive wafer may be prepared with an excess of donors so as to be of N-conductivity type, and an acceptor impurity may be diffused into the wafer to form a surface zone of P-type conductivity over a central zone of N-type conductivity. Electrode materials of opposite conductivity type are then used, and the polarity of bias voltages are also reversed as required.

Although the invention has been illustrated with germanium as a representative semiconductor, it will be understood that other crystalline semiconductive materials such as silicon, gallium arsenide, indium phosphide, or the like may be utilized instead of germanium. Appropriate acceptor and donor materials are used with each semiconductor. For example, with indium phosphide and gallium arsenide suitable acceptor materials are zinc and cadmium, while suitable donor materials are selenium and tellurium.

What is claimed is:

1. A circuit element comprising a given conductivity type monocrystalline semiconductive wafer having opposed major faces and a surface zone of opposite conductivity type, the interface between said surface zone and the central zone of said wafer comprising an internal junction, a pellet of given conductivity type-determining material alloyed to a first portion of one major face, said pellet extending through said surface zone into said central zone, a rectifying electrode contacting a first portion of the opposite wafer face, a non-rectifying electrode contacting a second portion of said opposite face, and a rectifying electrode contacting a second portion of said one major face.

2. An internal junction circuit element comprising a given conductivity type monocrystalline semiconductive wafer having opposed major faces and a surface zone of opposite conductivity type, the interface between said surface zone and the central zone of said wafer comprising a diffused internal PN junction, a pellet of given conductivity type-determining material alloyed to a first portion of one major face, said pellet extending through said surface zone into said central zone, the interface between said pellet and said central zone comprising an ohmic contact, a rectifying electrode contacting a first portion of the opposite wafer face, a non-rectifying electrode contacting a second portion of said opposite face, and a rectifying electrode contacting a second portion of said one major face.

3. An internal junction circuit element comprising a given conductivity type monocrystalline semiconductive wafer having opposed major faces and a surface zone of opposite conductivity type, the interface between said surface zone and the central zone of said wafer comprising a diffused internal PN junction, a pellet of given conductivity type-determining material alloyed to a first portion of one major face, said pellet extending through said surface zone into said central zone, the interface between said pellet and said central zone comprising an ohmic contact, an emitter electrode contacting a first portion of the opposite wafer face, a base electrode contacting a second portion of said opposite face, and another emitter electrode contacting a second portion of said one major face.

4. An internal junction circuit element comprising a given conductivity type monocrystalline semiconductive wafer having opposed major faces and a surface zone of opposite conductivity type, the interface between said surface zone and the given conductivity type central zone of said wafer comprising a diffused internal PN junction, a collector electrode pellet of given conductivity type-determining material alloyed to a first portion of one wafer face, said pellet extending through said surface zone into said central zone, the interface between said pellet and said central zone comprising an alloyed non-rectifying contact, an emitter electrode in rectifying contact with a first portion of the opposite wafer face, a base electrode in non-rectifying contact with a second portion of said opposite face, and another emitter electrode in rectifying contact with a second portion of said one wafer face.

5. A circuit element comprising a given conductivity type monocrystalline semiconductive wafer having opposed major and minor faces and having a surface zone of opposite conductivity type, the interface between said surface zone and the central zone of said wafer comprising an internal junction, a pellet of given conductivity type-determining material alloyed to one said minor wafer face, said pellet extending through said surface zone into said central zone, a now-rectifying electrode contacting the opposite minor wafer face, a rectifying electrode contacting one major wafer face, and a rectifying electrode contacting the opposite major wafer face.

6. An internal junction circuit element comprising a given conductivity type monocrystalline semiconductive wafer having opposed major and minor faces and having a surface zone of opposite conductivity type, the interface between said surface zone and the central zone of said wafer comprising a diffused internal PN junction, a pellet of given conductivity type-determining material alloyed to one said minor wafer face, said pellet extending through said surface zone into said central zone, the interface between said pellet and said central zone comprising an ohmic contact, a non-rectifying electrode contacting the opposite minor wafer face, a rectifying electrode contacting one major face, and a rectifying electrode contacting the opposite major face.

7. An internal junction circuit element comprising a given conductivity type monocrystalline semiconductive wafer having opposed major and minor faces and having a surface zone of opposite conductivity type, the interface between said surface zone and the central zone of said wafer comprising a diffused internal PN junction, a pellet of given conductivity type-determining material alloyed to one said minor wafer face, said pellet extending through said surface zone into said central zone, the interface between said pellet and said central zone comprising an ohmic contact, a base electrode contacting the opposite minor wafer face, a first emitter electrode contacting one major wafer face, and a second emitter electrode contacting the opposite major wafer face.

8. An internal junction circuit element comprising a given conductivity type monocrystalline semiconductive wafer having opposed major and minor faces and having a surface zone of opposite conductivity type, the interface between said surface zone and the given conductivity type central zone of said wafer comprising a diffused internal PN junction, a collector electrode pellet of given conductivity type-determining material alloyed to one said minor wafer face, said pellet extending through said surface zone into said central zone, the interface between said pellet and said central zone comprising an alloyed non-rectifying contact, a base electrode in non-rectifying contact with the opposite minor face, a first emitter electrode in rectifying contact with one major wafer face, and a second emitter rectifying electrode in rectifying contact with the opposite major wafer face.

References Cited in the file of this patent

UNITED STATES PATENTS

| | | |
|---|---|---|
| 2,705,767 | Hall | Apr. 5, 1955 |
| 2,792,539 | Lehovec | May 14, 1957 |
| 2,794,846 | Fuller | June 4, 1957 |
| 2,810,870 | Hunter | Oct. 22, 1957 |
| 2,842,668 | Rutz | July 8, 1958 |
| 2,843,511 | Pankove | July 15, 1958 |
| 2,861,018 | Fuller et al. | Nov. 18, 1958 |
| 2,874,341 | Biondi et al. | Feb. 17, 1959 |
| 2,889,499 | Rutz | June 2, 1959 |
| 2,943,006 | Henkels | June 28, 1960 |